United States Patent [19]

Ready

[11] Patent Number: 5,206,601
[45] Date of Patent: Apr. 27, 1993

[54] ORDER STATISTIC SIGNAL PROCESSOR FOR ESTIMATING VALUES OF SIGNAL PARAMETERS AND DEMODULATING AMPLITUDE-, PHASE-, AND FREQUENCY-MODULATED SIGNALS

[75] Inventor: Patrick J. Ready, Westlake Village, Calif.

[73] Assignee: Elanix Inc., Westlake Village, Calif.

[21] Appl. No.: 875,743

[22] Filed: Apr. 29, 1992

[51] Int. Cl.[5] .................. H03D 1/02; H03D 3/02; H03D 5/00
[52] U.S. Cl. .................. 329/317; 307/516; 307/526; 307/359; 328/133; 328/151; 329/325; 329/327; 329/345; 329/346; 329/363; 375/81; 455/214; 455/337
[58] Field of Search .............. 329/317, 325, 327, 345, 329/346, 363; 375/80, 81, 94; 455/214, 337; 328/140, 151, 133; 307/516, 526, 358, 359; 364/724.01

[56] References Cited

U.S. PATENT DOCUMENTS

| 4,547,737 | 10/1985 | Gibson | 329/343 |
| 5,138,567 | 8/1992 | Mehrgardt | 364/724.01 |

OTHER PUBLICATIONS

J. S. Jimmy Li & W. Harvey Holmes, "Analog Implementation of Median Filters for Real-Time Signal Processing", IEEE Trans. on Circuits & Systems, vol. 35, No. 8, Aug., 1988, pp. 1032-1033.

Primary Examiner—Siegfried H. Grimm
Attorney, Agent, or Firm—Robert E. Malm

[57] ABSTRACT

The order statistic signal processor obtains continuing estimates of amplitude, phase, or frequency of an input signal based on order statistics. By way of definition, the P'th order statistic for a set of samples from a continuously distributed process is the P'th largest of the samples. Where a signal parameter fluctuates with time as a result of contamination by noise and interference and where the noise fluctuation rate is much greater than the rate at which changes in a signal parameter occur, an order statistic associated with a set of signal parameter samples can serve as an estimate of the signal parameter. The order statistic signal processor is based on an iterative process whereby the prior estimate of a signal parameter, i.e. amplitude or phase, is subtracted from each of a plurality of signal parameter samples obtained over a period of time. The differences are converted to quantities of fixed magnitude with signs corresponding to the differences. The converted differences are summed, the sum is biased, and the biased sum is then integrated to provide a new estimate of the signal parameter. The signal parameter estimate obtained in this way corresponds to a particular order statistic for the signal parameter sample set that is obtained each time the process repeats. A particular order statistic is selected by adjusting the bias level.

18 Claims, 3 Drawing Sheets

Hard Limit

Some Linearity

Almost Linear

Multi-Level Discrete
(Quantization)

ORDER STATISTIC SIGNAL PROCESSOR FOR ESTIMATING VALUES OF SIGNAL PARAMETERS AND DEMODULATING AMPLITUDE-, PHASE-, AND FREQUENCY-MODULATED SIGNALS

BACKGROUND OF INVENTION

This invention relates generally to processes and apparatus for estimating the values of signal parameters in the presence of noise and interference and for demodulating amplitude-, phase-, and frequency-modulated signals. More particularly, the invention relates to signal processors that utilize order statistics in performing the above functions.

Order statistics are a mature field within mathematical statistical analysis. These statistics are defined as follows. Let $x_1, x_2, \ldots, x_N$ be samples from a continuously distributed process. Let $y_1$ be the smallest of the $x_1$, $y_2$ be the next smallest, and so on through $y_N$ which is the largest of the $x_1$. Then $y_i$ is defined as the i'th order statistic of the random samples $x_1, x_2, \ldots, x_N$.

A familiar order statistic is the median. It is defined as $y_{(N+1)/2}$ if N is odd and as the average of $y_{N/2}$ and $y_{1+N/2}$ if N is even. The maximum $y_N$ and the minimum $y_1$ are also widely used.

Another statistic that is frequently desired is the mean which is defined as the sum over i of $x_i$ divided by N.

The recent literature has reported a significant number of applications requiring order statistics. For example, Gandhi et al. (Gandhi, P. P. and Kassam, S. A., "Design and Performance of Combination Filters for Signal Restoration", IEEE Transactions on Signal Processing, Jul., 1991) describe a class of non-linear moving-window filters that use rank order for the restoration of signals imbedded in additive white Gaussian noise. Haweel et al. (Haweel, Tarek I. and Clarkson, P. M., "A Class of Order Statistics LMS Algorithms", IEEE Transactions on Signal Processing, January, 1992) describe significant improvements to gradient-based adaptive filters using order statistics filtering of the gradient estimates. The field of image processing has long recognized the usefulness of order statistics filtering, as noted by Pratt (Pratt, William K., *Digital Image Processing*, pp. 330-333, John Wiley & Sons, 1978).

Additional applications have been reported by Nie and Unbehauen (Nie, X. and Unbehauen, R., "Edge Preserving Filtering by Combining Nonlinear Mean and Median Filters", IEEE Transactions on Signal Processing, November, 1991), Hwang (Hwang, J., "Systolic Architectures for Radar CFAR Detectors", IEEE Transactions on Signal Processing, October 1991), and Binenbaum et al. (Binenbaum, N. et al., "Neural Networks for Signal/Image Processing Using the Princeton Engine Multi-Processor", Proceedings of the IEEE Workshop on Neural Networks for Signal Processing, September 1991).

Order statistics can also be utilized to advantage in phase-lock-loop (PLL) and frequency-lock-loop (FLL) receivers that are found in virtually all modern communication systems. The rationale is that the theshold level for both PLL and FLL perforance is completely dominated by the onset of cycle slipping that is characterized as impulse noise. Order statistics filters, such as the median filter, should result in a significant extension of the threshold level and thereby improve receiver performance.

By extending the threshold level in phase and frequency lock loops the performance of virtually all communication links will be enhanced. The ability to remove non-Gaussian (as well as truly Gaussian) noise from baseband bit streams, without the level of inter-symbol interference normally associated with linear filters, could significantly improve a communication system's performance.

Potential improvements to magnetic storage devices (e.g. computer disks) also exist since the analog signal received from such devices suffers from impulse (or non-Gaussian) noise caused by magnetic drop-outs in the medium.

Until now, all implementations of true order statistic filters (also known as rank order processors) have been required to be digital. Ranking data in a moving window and selecting the sample having the desired rank for output is so very non-linear that digital methods were apparently the only feasible means of implementation. As a result, the usual hardware and bandwidth constraints normally associated with a digital processor were imposed.

There is a need for an order statistic processor which can perform the required processing in real time on wideband signals without the cost penalty imposed by high-speed digital processing approaches.

BRIEF SUMMARY OF INVENTION

The order statistic signal processor, in a simple and direct manner, provides estimates of amplitude, phase, or frequency of signals in the presence of noise and interference utilizing a process for determining the order statistics of signals. The processor thereby functions as an amplitude estimator or as an amplitude, phase, or frequency demodulator depending on the needs of the user. The processor can be implemented using either analog or digital techniques. However, the analog approach is particularly attractive for operations on wideband signals in real time where circuit speed is of the essence. An analog version of the processor could be implemented as a single integrated circuit and is consequently a particularly attractive solution where low cost and small size are important.

The order statistic signal processor is based on a feedback process whereby the prior estimate of a signal parameter, i.e. amplitude or phase, is subtracted from each of a plurality of signal parameter samples obtained over a period of time. The differences are converted to magnitude quantities with signs corresponding to the differences. The converted differences are summed, the sum is biased, and the biased sum is then integrated to provide a new estimate of the signal parameter. The signal parameter estimate obtained in this way corresponds to a particular order statistic for the signal parameter sample set that is obtained each time the process repeats. A particular order statistic is selected by adjusting the bias level.

One of the objects of the invention is to provide in a single configuration a signal processor for the continuing estimation of signal amplitude, phase, or frequency based on order statistics that can also function as a demodulator of either amplitude-modulated, phase-modulated, or frequency-modulated signals. Another object of the invention is to provide a signal processor having the forgoing characteristics that can be implemented as an integrated circuit and can handle wideband signals in real time.

DESCRIPTION OF THE PREFERRED EMBODIMENT

The function of the order statistic signal processor is to estimate the values of certain signal parameters—specifically amplitude, phase, and frequency—in the presence of noise and interference and to demodulate amplitude-, phase-, and frequency-modulated signals. To accomplish these purposes the order statistic signal processor determines the i'th order statistic or other statistics of N samples of a particular signal parameter where N is an integer. The N samples will usually be taken at equal intervals $\delta t$ although equal-interval sampling is by no means a requirement of the invention.

Figure 1:
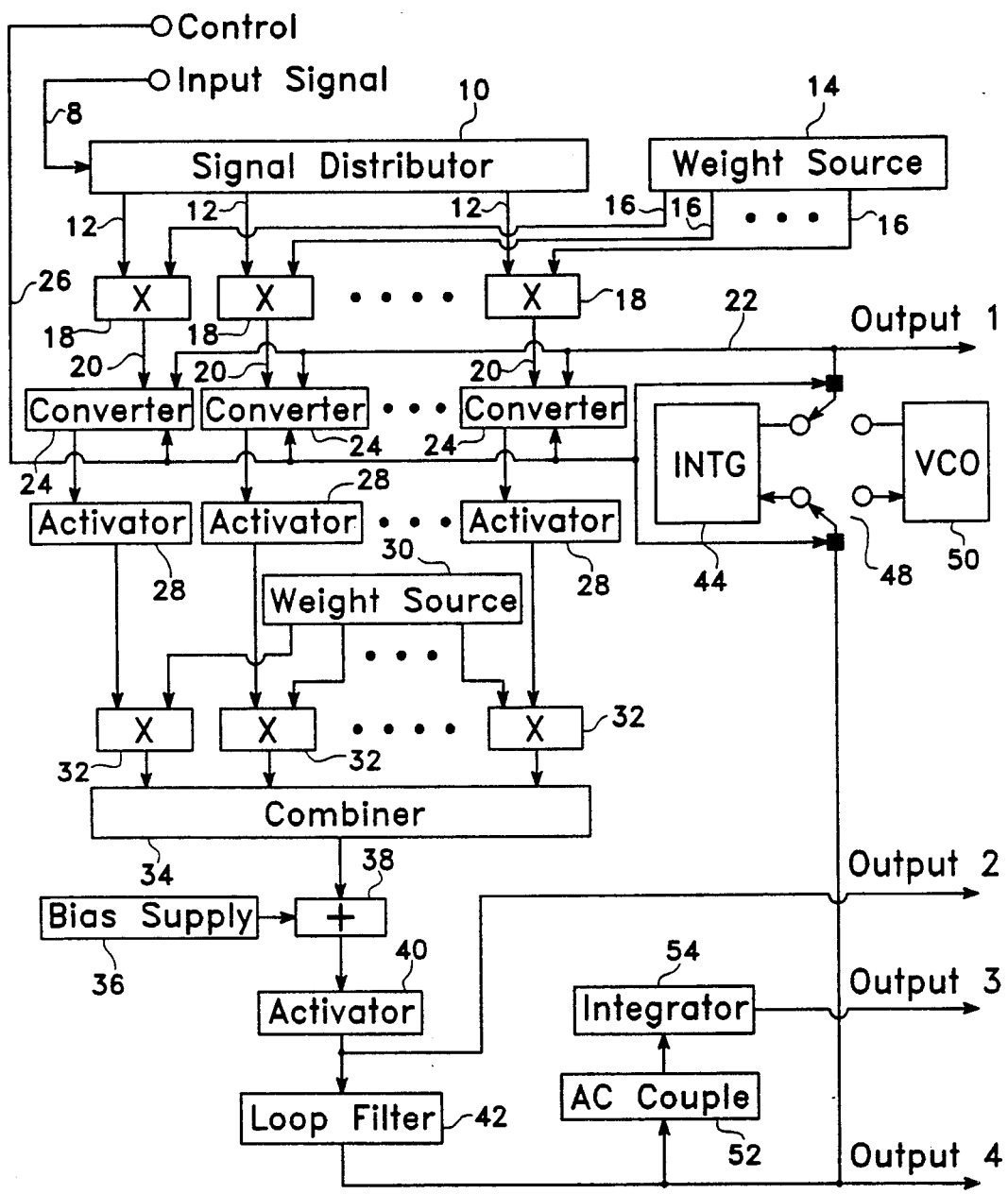
FIG. 1 shows the functional block diagram of the order statistic signal processor that utilizes order statistics in estimating the values of certain signal parameters in the presence of noise and interference and that also is capable of demodulating amplitude-, phase-, and frequency-modulated signals.
Figure 2A:
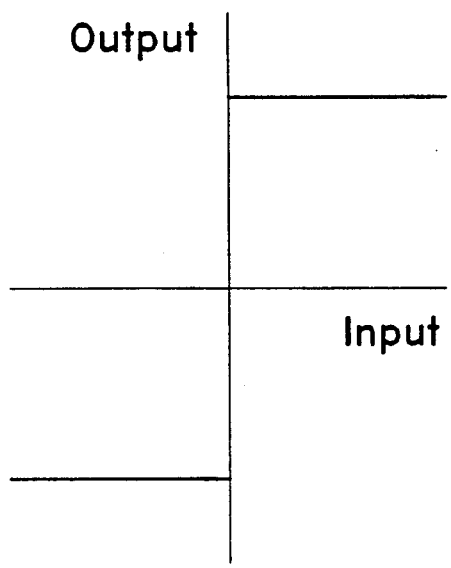
FIG. 2 illustrates a range of transfer functions for the activators that are elements of the order statistic signal processor.
Figure 2B:
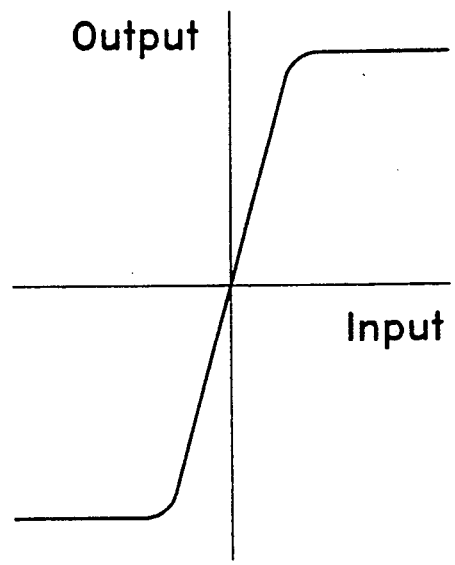
Figure 2C:
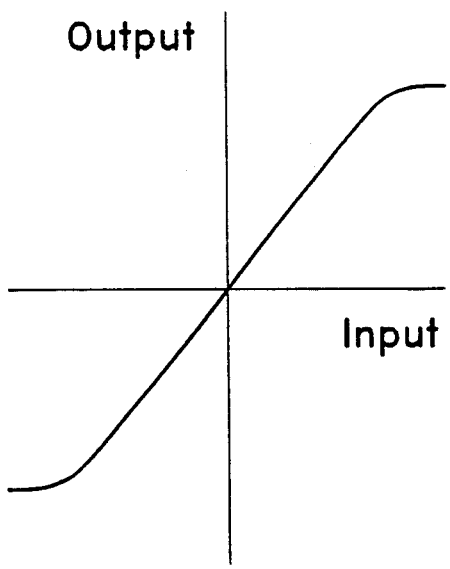
Figure 2D:
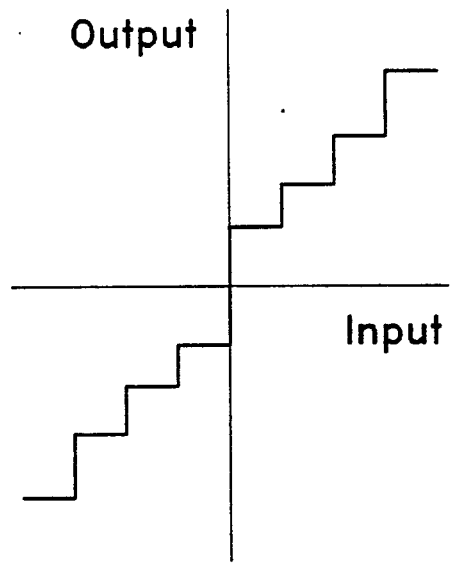

The order statistic signal processor is shown in block diagram form in FIG. 1. The input signal s(t) 8 enters the signal distributor 10 which generates N signals $S_n(t)$ that appear on N lines 12, three of which are shown in the figure. The signal $S_n(t)$ that appears on the n'th line is defined in terms of the input signal by the equation $$S_n(t_s) = S[t_s - (n-1)\delta t] \qquad (1)$$

The statistic processing time $t_s$ usually occurs at regular intervals but may occur at irregular intervals in certain versions of the invention.

One embodiment of the signal distributor 10 generates signals $S_n(t)$ that are defined by the equations $$S_n(t) = S[t - (n-1)\delta t] \qquad (2)$$

which are obviously in accord with equation (1). The implementation of this embodiment of the signal distributor 10 is simply a tapped delay line with N taps spaced $\delta t$ apart.

In those situations where the use of a tapped delay line is impractical, an array of N sample-and-hold circuits may be used. The first sample-and-hold circuit samples the input signal at $t_s$ and the remaining sample-and-hold's at intervals of $\delta t$ thereafter. All sample-and-hold's hold the samples for a time $N\delta t$ after sampling. The output of the n'th sample-and-hold circuit is given by the equation $$S_n(t) = s[t_s - (n-1)\delta t] \qquad (3)$$

where $$t_s - (n-1)\delta t \leq t < t_s + (N-n+1)\delta t \qquad (4)$$

It should be noted that equation (3) is also in accord with equation (1).

The output signals from the signal distributor 10 are multiplied by weights supplied by weight source 14 on lines 16 by multipliers 18. The multiplier output signals appearing on lines 20 are combined with the signal on line 22 in the converters 24. The way in which the signals are combined is governed by the binary control signal 26. When the control signal is equal to "zero" (mode 0), the signal on line 22 is subtracted from the signals on lines 20. When the control signal is equal to "one" (mode 1), the signals on lines 20 and the signal on line 22 are multiplied by means of a multiplying circuit and the resulting product signal is then lowpass filtered.

Mode 1 is typically utilized when the input signal is a band-limited signal at some particular frequency and the signal on line 22 is a modulated sinusoid at approximately the same frequency. Under these circumstances, the converters 24 function as mixers translating the signal distributor signals to baseband with the lowpass filtering operation serving to eliminate the sum frequencies that result from the multiplication.

The converter outputs are passed through the activators 28 with transfer functions tailored for the particular application as illustrated in FIG. 2. The transfer functions may range in effect from hard limiting (a) to moderately-hard limiting (b) to soft limiting (c) with another option being multi-level quantization (d).

The outputs of the activators 28 and the weights supplied by the weight source 30 are multiplied by the multipliers 32 and the products are added together by the combiner 34.

A positive or negative bias voltage supplied by the bias supply 36 is added algebraicly to the combiner output by the adder 38 and the adder output signal is the input to the activator 40. The adder signal is modified by the activator 40 in accordance with a transfer function of the variety shown in FIG. 2.

The activator signal is processed by the loop filter 42. In mode 0 the double-pole, double-throw (DPDT) switch 48 connects the loop filter output to the input of the intergrator 44 and the output of the integrator 44 becomes one of the inputs to the N converters 24. In mode 0, the output of the integrator 44 represents a statistic of input signal amplitude sample sets.

In mode 1 the switch 48 connects the loop filter output to the input of the voltage-controlled oscillator (VCO) 50 and the output of the VCO 50 to one set of inputs to the ocnverters 24. The VCO 50 is thereby caused to produce a sinusoid having a frequency linearly related to the integrator signal. This sinusoid is the input to the converters 24 in mode 1 and is made available for external use as output 1. In mode 1, the output of the loop filter 42 represents a statistic of the input signal frequency sample sets.

Mode 0 is utilized for measuring order statistics of input signal amplitude sample sets. In measuring an order statistic, the weights supplied by the weight sources 14 and 30 are set equal to 1, the activators 28 have hard-limiting transfer functions like (a) in FIG. 2, and the activator 40 has a soft-limiting transfer function like (c) in FIG. 2.

If the order statistic to be measured is the median, the bias voltage supplied by the bias supply 36 is set equal to 0. With these assumptions and after transients associated with start up of the order statistic signal processor have died down, the output of the integrator 44 will be the median of the input signal. The integrator signal is subtracted from the input signal samples by converters 24. If the integrator signal is equal to the median of the input signal samples, one-half of the signal samples will be less than the median and one-half will be greater. Consequently, one-half of the converters 24 will produce negative signals and the other one-half will produce positive ones. It follows that one-half of the activators 28 will produce the negative voltage limit and the other one-half will produce the positive voltage limit. Since the weights provided by the weight source 30 are "1's", the sum of the activator outputs produced by the combiner 34 will be 0. Since the bias voltage is 0 and the transfer function of the activator 40 is linear, the 0 combiner output passes through the adder 38, the activator 40, and the loop filter 42 unchanged. The output of the integrator 44 does not change with the further integration of 0 and remains equal to the median of the input signal samples.

Let us now assume that the output from the integrator 44 is greater than the median and that it is sufficiently greater to cause one of the converter signals that was positive to be negative. Now, one-half of the activator signals plus one are negative and one-half minus one are positive resulting in a negative signal out of the combiner 34 and a negative correction to the output of the integrator 44. Similarly, if the output from the integrator 44 is lower than the median, a positive correction will be made to the integrator output. Thus, the feedback of the integrator output through switch 48 to converters 24 causes the integrator output to track the median of the input signal. It is important to note that the gain-bandwidth characteristic of the feedback loop must be properly adjusted by means of the transfer function of the loop filter 42 and the gains of the activators 28 and 40 to achieve fast response and at the same time avoid oscillation.

If the order statistic to be measured is the P'th (where P=1 corresponds to the smallest signal sample), the bias voltage is set equal to (N+1−2P)L where L is the magnitude of the positive and negative limiting voltages of the activators 28. The integrator output will then seek a level where P−1 of the signal samples are lower and N−P are higher than the integrator output. When the integrator output reaches this level, the combiner output will equal the bias voltage, the outputs of the adder 38 and the activator 40 will be 0, and the integrator output will remain constant.

It may be desirable for certain applications to let the bias voltage be a time-varying signal.

If the mean of the signal samples is to be measured rather than an order statistic, activators 28 are given transfer functions like (c) in FIG. 2. The bias voltage supplied by bias supply 36 is again set to 0. The effect of the activators 28, the multipliers 32, and the combiner 34 is simply to add the outputs from the converters 24 and apply a gain to the sum. If the integrator output is equal to the mean of the signal samples, the sum of the converter outputs will be 0 and the integrator output will remain unchanged. If the integrator output is different from the mean, a non-zero signal will be produced by the combiner 34 which will tend to drive the integrator output toward the mean. Thus, under the circumstances described, the integrator output will track the mean of the signal samples.

In mode 1 the order statistic signal processor functions as a demodulator of phase- and frequency-modulated input signals. In describing the mode 1 operation it will be assumed that the order statistic signal processor is set up in the same way as it was for measuring an order statistic or the mean in mode 0 except that the signal on the mode control line 26 causes the switch 48 to connect the loop filter output to the VCO input and the VCO output to the line 22.

Let us assume that the input signal s(t) is the sinusoid $\sin[2\pi f_c t + \theta(t)]$ where $f_c$ is some nominal frequency and any change in phase or nominal frequency is expressed by $\theta(t)$. The signal that appears on the n'th output line from the signal distributor 10 is given by the equation $$s_n(t) = \sin\{2\pi f_c[t-(n-1)\delta t] + \theta[t-(n-1)\delta t]\} \quad (5)$$

The signal from the VCO 44 is given by the equation $$s_{vco}(t) = \cos[2\pi f_c t + \theta_{vco}(t)] \quad (6)$$

where any change in the frequency of the VCO 50 is expressed by the phase $\theta_{vco}(t)$. The signal distributor signals (5) (weighted by "1's" by the multipliers 18) and the VCO signal (6) are multiplied together and lowpass filtered by the converters 24. The output signal from the n'th converter is given by the equation $$s_c(t) = \tfrac{1}{2}\sin\{\theta[t-(n-1)\delta t] - \theta_{vco}(t)\} \quad (7)$$

where it has been assumed that the signal distributor delays are an integral number of input signal periods, i.e. $f_c \delta t$ = an integer.

If the transfer characteristics of the activators 28 are like (a) of FIG. 2 and the bias voltage from bias supply 36 is set to 0, the VCO 50 will adjust its output until $$\theta_{vco}(t) = \text{median } \{\theta[t-(n-1)\delta t]\} \quad (8)$$

This condition marks the locking of the VCO signal to the input signal and as a result the phase of the VCO signal becomes a measure of the phase of the input signal and the frequency of the VCO signal becomes a measure of the frequency of the input signal.

The input to the VCO is linearly related to the frequency of the VCO and consequently provides a linear measure of the frequency of the VCO 50 and the frequency of the input signal after lock-up.

An input signal which is phase modulated at the nominal frequency is demodulated by the combination of the AC coupling circuit 52 and the integrator 54. The frequency of the VCO signal is available at the output of the loop filter 42 and can be derived mathematically by taking the derivative with respect to time of the argument of the cosine function in equation (6) and dividing by $2\pi$.

$$f_{vco} = f_c + d\theta_{vco}(t)/dt \quad (9)$$

The AC coupling circuit 52 blocks the first term in equation (9) from entering the integrator 54 thereby permitting the integrator 54 to integrate only the second term. The output of the integrator 54 corresponds to $\theta_{vco}(t)$ which after lock-up is a measure of any phase modulation that appears on the input signal.

It is desirable in certain applications of the order statistic signal processor to use weighting functions that are other than uniform. Such weighting functions are particularly appropriate where a signal statistic is being continually measured for a set of samples within a window where signal samples slide into the window on one side and slide out on the other side and the signal statistic changes abruptly from time to time. By weighting the signal samples more strongly near the center of the window and less strongly near the edges, one finds that more accurate estimates of a statistic can be obtained.

The use of weighting functions is described extensively in *Digital Signal Processing*, A. V. Oppenheim and R. W. Shafer, Prentice-Hall, Englewood Cliffs, N.J. (1975).

The order statistic signal processor provides two opportunities for weighting the signal samples or derivatives thereof. Weight source 14 provides the means for applying arbitrary weights to the signals generated by the signal distributor 10. Weight source 30 provides the means for weighting the signal distributor signals after modification by the converters 24 and the activators 28.

Figure 3:
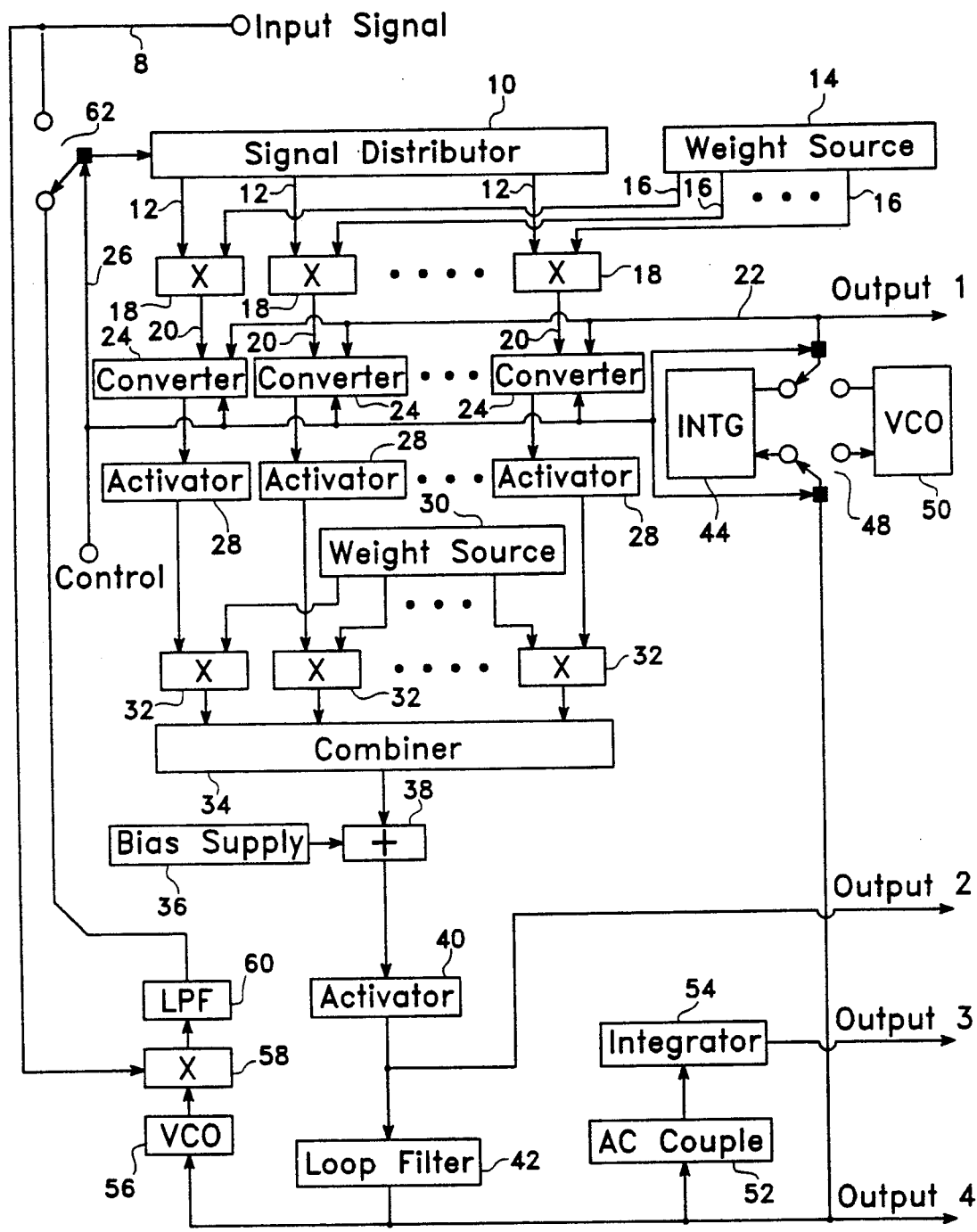
FIG. 3 illustrates a refinement of the order statistic signal processor shown in FIG. 1.

A further refinement of the order statistic signal processor affecting only the mode 0 operation is shown in FIG. 3. The refinement consists of the VCO 56, the multiplier 58, and the lowpass filter 60.

The output of the loop filter 42 is connected to the input of the VCO 56. The output signal from the VCO 56 and the input signal 8 are multiplied together in the multiplier 58 and the resulting product signal is fed into the lowpass filter 60. The high frequency components of the product signal are rejected by the lowpass filter 60 and consequently only the baseband components of the product signal appear at the output of the filter. The signal-pole, double-throw (SPDT) switch 62, which is controlled by the binary signal on the control line 26, connects the output of the lowpass filter 60 to the input of the signal distributor 10 when mode 0 is selected.

The original components of the order statistic signal processor that were first shown in FIG. 1 operate in the manner previously described. In mode 1, switch 62 connects the input signal line 8 to the signal distributor 10 and the operation of the order statistic signal processor is as previously described.

One skilled in the art will recognize that the preferred embodiment, as described above, could be implemented with either analog or digital techniques. The use of analog technology is favored in that the processor could be implemented in a single integrated circuit and an analog version could handle much wider bandwidth signals in real time than could a digital version. The precision of a digital version of the signal processor could bias this viewpoint, particularly if wideband signals were not involved.

What is claimed is:

1. An order statistic signal processor for estimating the values of signal parameters and demodulating amplitude-, phase-, and frequency-modulated signals, said processor being adapted to receive an input signal and producing an output signal at a processor output terminal, said input signal being characterized by a plurality of parameters, one of said parameters being selected for processing, said processor comprising:
    a means for generating a parameter reference;
    a means for subtracting at successively-occurring times said parameter reference from each of a plurality of delayed versions of said selected signal parameter thereby obtaining differences;
    a means for limiting the magnitudes of said differences to a predetermined value and preserving the algebraic sign of said differences;
    a means for adding said limited differences together thereby obtaining said output signal.

2. The order statistic signal processor of claim 1 wherein said parameter reference is the integral over time of said output signal if said selected parameter is signal amplitude, said parameter reference being the integral over time of said output signal excluding any time-invariant component of said output signal if said selected parameter is the phase of a periodic input signal.

3. The order statistic signal processor of claim 1 further comprising:
    a means for limiting the magnitude of said sum to a predetermined value and preserving the sign of said sum, said output signal being the limited sum.

4. The order statistic signal processor of claim 1 further comprising:
    a means for adding a bias voltage to said sum, said output signal being the biased sum.

5. The order statistic signal processor of claim 1 further comprising:
    a means for weighting each of said limited differences.

6. The order statistic signal processor of claim 1 further comprising:
    a means for limiting the magnitude of said sum to a predetermined value and preserving the sign of said sum, said output signal being the limited sum;
    a means for adding a bias voltage to said sum prior to limiting;
    a means for weighting each of said limited differences.

7. The order statistic signal processor of claim 1 wherein said selected parameter is signal amplitude, said order statistic signal processor further comprising:
    a means for weighting each of said plurality of delayed versions of said selected signal parameter prior to obtaining said differences.

8. The order statistic signal processor of claim 1 wherein said selected parameter is signal phase, said order statistic signal processor further comprising:
    a means for weighting each of said differences.

9. The order statistic signal processor of claim 1 wherein said parameter reference generating means and said difference obtaining means comprise:
    a delay line having a plurality of taps, said delay line being adapted to receive said input signal, delayed versions of said input signal being available at said taps;
    a means for providing a signal reference, said signal reference providing means being an integrator if said selected parameter is signal amplitude, the input to said integrator being said processor output signal, the output of said integrator being said signal reference, said signal reference providing means being a voltage-controlled oscillator (VCO) if said selected parameter is signal phase, the input to said VCO being said processor output signal, the output of said VCO being said signal reference;
    a plurality of converters, each of said converters having a first input, a second input, and an output, said delay line taps being connected to said first inputs of said converters, said signal reference being fed into said second inputs of said converters, said converters subtracting said signal reference from said delay line signals if said selected parameter is signal amplitude, said converters multiplying said signal reference and said delay line signals and lowpass filtering the resulting products if said selected parameter is signal phase, the outputs of said converters being said differences.

10. The order statistic signal processor of claim 1 wherein said parameter reference generating means and said difference obtaining means comprise:
    a delay line having a plurality of taps, said delay line being adapted to receive said input signal, delayed versions of said input signal being available at said taps;

a means for storing a plurality of signal weights;

a plurality of signal multipliers, each of said signal multipliers having a first input, a second input, and an output, said delay line taps being connected to said first inputs of said signal multipliers, said signal weights being fed into said second inputs of said signal multipliers, a means for providing a signal reference, said signal reference providing means being an integrator if said selected parameter is signal amplitude, the input to said integrator being said processor output signal, the output of said integrator being said signal reference, said signal reference providing means being a voltage-controlled oscillator (VCO) if said selected parameter is signal phase, the input to said VCO being said processor output signal, the output of said VCO being said signal reference;

a plurality of converters, each of said converters having a first input, a second input, and an output, the outputs of said signal multipliers being connected to said first inputs of said converters, said signal reference being fed into said second inputs of said converters, said converters subtracting said signal reference from said signal multiplier signals if said selected parameter is signal amplitude, said converters multiplying said signal reference and said signal multiplier signals ans lowpass filtering the resulting products if said selected parameter is signal phase, the outputs of said converters being said differences.

11. The order statistic signal processor of claim 1 wherein said parameter reference generating means and said difference obtaining means comprise:

a plurality of sample-and-hold circuits, said input signal being sampled by said sample-and-hold circuits in sequence, the samples being held by said sample-and-hold circuits until said input signal is resampled;

a means for providing a signal reference, said signal reference providing means being an integrator if said selected parameter is signal amplitude, the input to said integrator being said processor output signal, the output of said integrator being said signal reference, said signal reference providing means being a voltage-controlled oscillator (VCO) if said selected parameter is signal phase, the input to said VCO being said processor output signal, the output of said VCO being said signal reference;

a plurality of converters, each of said converters having a first input, a second input, and an output, the outputs of said sample-and-hold circuits being connected to said first inputs of said converters, said signal reference being fed into said second inputs of said converters, said converters subtracting said signal reference from said sample-and-hold circuit signals if said selected parameter is signal amplitude, said converters multiplying said signal reference and said sample-and-hold circuit signals and lowpass filtering the resulting products if said selected parameter is signal phase, the outputs of said converters being said differences.

12. The order statistic signal processor of claim 1 wherein said parameter reference generating means and said difference obtaining means comprise:

a plurality of sample-and-hold circuits, said input signal being sampled by said sample-and-hold circuits in sequence, the samples being held by said sample-and-hold circuits until said input signal is resampled;

a means for storing a plurality of signal weights;

a plurality of signal multipliers, each of said signal multipliers having a first input, a second input, and an output, the outputs of said sample-and-hold circuits being connected to said first inputs of said signal multipliers, said signal weights being fed into said second inputs of said signal multipliers, a means for providing a signal reference, said signal reference providing means being an integrator if said selected parameter is signal amplitude, the input to said integrator being said processor output signal, the output of said integrator being said signal reference, said signal reference providing means being a voltage-controlled oscillator (VCO) if said selected parameter is signal phase, the input to said VCO being said processor output signal, the output of said VCO being said signal reference;

a plurality of converters, each of said converters having a first input, a second input, and an output, the outputs of said signal multipliers being connected to said first inputs of said converters, said signal reference being fed into said second inputs of said converters, said converters subtracting said signal reference from said signal multiplier signals if said selected parameter is signal amplitude, said converters multiplying said signal reference and said signal multiplier signals and lowpass filtering the resulting products if said selected parameter is signal phase, the outputs of said converters being said differences.

13. The order statistic signal processor of claim 1 further comprising a means for translating said input signal to baseband prior to any other operations performed on said input signal in said order statistic signal processor.

14. The order statistic signal processor of claim 13 wherein said translating means is comprised of a voltage-controlled oscillator (VCO) having an input and an output, a signal multiplier having two inputs and an output, and a lowpass filter having an input and an output, the input to said VCO being said signal processor output signal, the output of said VCO and said input signal to said order statistic signal processor constituting the inputs to said multiplier, the input to said lowpass filter being the output of said multiplier.

15. A process for estimating a parameter of a target electrical signal by measuring a statistic for a plurality of samples of said parameter, said process comprising the steps:

(a) entering an initial estimate of said statistic for said plurality of signal parameter samples in a saved-estimate memory device, the contents of said saved-estimate memory device being known as the saved estimate;

(b) sampling a parameter of said signal at a plurality of successively-occurring times thereby obtaining a plurality of signal parameter samples;

(c) generating a signal parameter reference, said parameter reference being the integral over time of said saved estimate if said selected parameter is signal amplitude, said parameter reference being the integral over time of said saved estimate excluding any time-invariant component of said output signal if said selected parameter is the phase of a periodic signal;

(d) subtracting at successively-occurring times said parameter reference from each of a plurality of delayed versions of said selected signal parameter thereby obtaining differences;

(e) limiting the magnitudes of said differences to a predetermined value and preserving the algebraic sign of said differences thereby obtaining limited differences;

(f) adding said limited differences together to obtain a sum;

(g) adding a bias voltage to said sum thereby obtaining a biased sum;

(h) entering said biased sum into said saved-estimate memory device;

(i) repeating steps (b) through (h) indefinitely, said saved estimate being an estimate of signal amplitude as a function of time if said selected parameter is amplitude, said saved estimate being an estimate of frequency as a function of time if said selected parameter is phase and said target signal is frequency modulated, the integral of said saved estimate excluding any zero-frequency component being phase as a function of time if said selected parameter is phase and said target signal is phase modulated.

16. A signal processor for the practice of the process of claim 15.

17. A process for estimating a parameter of a target electrical signal by measuring a statistic for a plurality of samples of said parameter, said process yielding a process signal, said process comprising the steps:

(a) generating a plurality of object signals, said object signals being either delayed replicas of said target signal or square-wave signals, said replicas being subject to different delays, said square-wave signals having amplitudes at any particular time corresponding to a plurality of prior samples of the amplitude of said target signal;

(b) multiplying each of said object signals by a weight thereby obtaining weighted object signals;

(d) generating a reference signal, said reference signal being equal to the integral of said process signal if said selected parameter is signal amplitude, said reference signal being a phase-continuous sinusoid having an instantaneous frequency linearly related to said process signal if said selected parameter is the phase of a periodic signal;

(e) subtracting said reference signal from each of said object signals if said selected parameter is signal amplitude, multiplying said reference signal by each of said object signals and lowpass-filtering the products if said selected parameter is the phase of a periodic target signal, thereby obtaining converted signals;

(f) limiting the magnitudes of said converted signals to a predetermined value and preserving the algebraic sign of said converted signals thereby obtaining limited signals;

(g) weighting said limited signals thereby obtaining weighted limited signals;

(h) adding said weighted limited signals together to obtain a sum signal;

(i) adding a bias voltage to said sum signal thereby obtaining a biased sum signal;

(j) limiting the magnitude of said biased sum signal to a predetermined value and preserving the algebraic sign of said biased sum signal thereby obtaining a process signal, said process signal being an estimate of signal amplitude as a function of time if said selected parameter is amplitude, said process signal being an estimate of frequency as a function of time if said selected parameter is phase and said target signal is frequency modulated, the integral of said process signal excluding any zero-frequency component being phase as a function of time if said selected parameter is phase and said target signal is phase modulated.

18. A signal processor for the practice of the process of claim 17.

* * * * *